March 10, 1953 F. W. SCHMIDT, JR 2,631,241

TUNING DEVICE FOR HIGH-FREQUENCY ELECTRICAL ENERGY

Filed April 23, 1949 3 Sheets-Sheet 1

INVENTOR.
Fred W. Schmidt, Jr.

BY Darby & Darby

ATTORNEYS

TUNING DEVICE FOR HIGH-FREQUENCY ELECTRICAL ENERGY

Filed April 23, 1949 3 Sheets-Sheet 2

INVENTOR.
FRED W. SCHMIDT, JR.
BY Darby & Darby
ATTORNEYS

March 10, 1953 F. W. SCHMIDT, JR 2,631,241

TUNING DEVICE FOR HIGH-FREQUENCY ELECTRICAL ENERGY

Filed April 23, 1949 3 Sheets-Sheet 3

INVENTOR.
FRED W. SCHMIDT, JR
BY Daly & Daly
ATTORNEYS

Patented Mar. 10, 1953 2,631,241

UNITED STATES PATENT OFFICE 2,631,241

TUNING DEVICE FOR HIGH-FREQUENCY ELECTRICAL ENERGY

Fred W. Schmidt, Jr., Cedar Grove, N. J., assignor to Allen B. Du Mont Laboratories, Inc., Passaic, N. J., a corporation of Delaware Application April 23, 1949, Serial No. 89,298

8 Claims. (Cl. 250—40)

This invention relates to apparatus for resonant tuning of high frequency electrical energy such as used for reception of radio and television signals and the like.

In radio and television receivers a variable tuning element is connected in the input circuits or stages thereof to make possible the selection of signals or different carrier frequencies as broadcast by the various stations. Such tuning elements constitute resonant frequency tuning in the local oscillator stage of the receiver and the mixer stage for combining the incoming signal with the local oscillator signal.

In order to obtain low internal noise when tuning in weaker signals, it is the usual practice to precede the mixer stage with a stage of signal frequency amplification, the latter having sufficient gain so that noise generated in other parts of the set does not add appreciably to the noise of the input tube and circuits. Another advantage in having a signal frequency stage of amplification before heterodyning is that there may be incorporated conveniently, within that stage, circuits selectively tuned to the signal so that other undesired signals are effectively eliminated. These selective circuits must be tuned as the local oscillator is tuned, and consequently it has been customary to gang together mechanically the means for tuning the local oscillator and one or more tunable selective signal frequency circuits.

In the case of television signals which must be amplified in wide band amplifiers, certain advantages are obtained by the use of variable inductance elements as tuning means in these preselective circuits. For example, in inductively tuned circuits, if the bandwidth is, by design, kept constant, the parallel impedance and hence the stage gain, remains constant. This means that both bandwidth and stage gain are kept at their optimum value over the entire tuning range.

In the design and use of inductance tuned elements for use at television signal frequencies, certain special problems exist. For adequate tuning range, the minimum inductance of these elements and associated circuits and connections must be kept to a minimum. For adequate stage gain with commercially available tubes, the capacitance to ground of the elements and connections must also be kept to a minimum. The elements and connections must have unusual physical rigidity, be thermally stable, and must not be affected by atmospheric moisture for a very small change in physical dimensions would detune the elements and cause an appreciable loss of performance.

It is an object of this invention to provide a new and improved tuning device for ultra-high frequency signals.

It is another object to provide a tuning device which is versatile in providing different electrical values and ranges.

It is another object of the invention to provide a tuning device which is inexpensive to manufacture and compact while providing the advantages of inductance tuning, of "ganging" and of unusual operating stability.

Other objects will be apparent from the following description, claims and drawings, in which—

Figure 1:
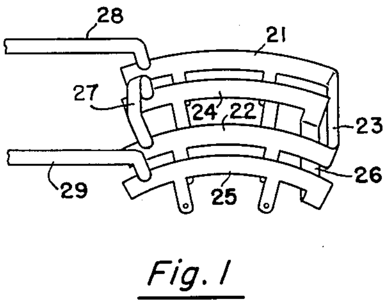
Figure 1 is a perspective view of the basic form of the elements comprising the invention.

The basic form of the tuning element in accordance with this invention may be seen by referring to Figure 1. The invention comprises basically the use of a plurality of U-shaped conducting elements bent so that each forms a tuned stub comprising a pair of parallel arms connected at one end by a short connecting bar. Each U-shaped element in itself may be designed and dimensioned to form an inductance element tuned to a particular frequency of electrical energy. In accordance with this invention, two such elements are combined and positioned so that the corresponding conducting arms are adjacent each other with the open ends of the U facing in the same direction. When such an arrangement is utilized, two elements comprise what has been termed a substantially two turn loop. In accordance with the concept of this invention, corresponding conducting arms are adjacent or in close proximity and a substantially two turn loop is formed when a conducting arm of one of said U-shaped elements is closer to the corresponding conducting arm, than to the non-corresponding arm of the other U-shaped element. In other words, surfaces normal to and through the boundaries of the area enveloped by one of said elements would intercept more than half of the area enveloped by the other of said elements. When such an arrangement is used the unit may be connected electrically in a number of different ways so that the mutual inductance between the elements may be aiding or opposing. Also, the elements may be connected in series or parallel relationship. Furthermore, greatly increased or decreased inductance values are realized. This positioning combined with a suitable switching arrangement provides a tuning unit which is capable of covering a wide variety of ranges of high frequencies in view of the electrical variations made possible.

Preferably, the two U-shaped units positioned as described above are connected to a common rotatable axis which is normal to the longitudinal axis of each of the units. These units then form rotor members. In furtherance of this concept, it is preferred that the longitudinal conducting arms be slightly curved to form the arc of a circle in which the units rotate. This structure is shown in Figure 1 in which one of the U elements comprises a pair of conducting arms 21 and 22 electrically connected at one end thereof by the base of the U, forming a connecting stub 23. The second element comprises a pair of conducting arms 24 and 25 joined by a stub 26 at the corresponding end thereof and positioned so that the arm 24 is closer to the arm 21 than it is to the arm 22. These units may be connected mechanically to a rotatable shaft in any well known desired way.

The stator elements of the tuning device comprise a conducting arm 28 which slidably contacts the conducting arm 21 and a second conducting arm 29 slidably contacting the conducting arm 25. To complete the two turn loop a stator connecting element 27 slidably connects and shorts the conducting arms 22 and 24 of the rotor element. As the shaft is rotated the tuning stubs vary in their resonant frequency characteristics as their electrical length changes in accordance with well known principles. That is, the electrically useful areas bounded by the electrically connected portions of the conductor tuning stubs or elements, are changed, thus changing the resonant frequency. In view of the positioning, however, the corresponding conducting arms 21 and 24 of the rotor element are electrically conducting in the same direction as are the other pair of conducting arms 22 and 25. Thus, the mutual inductance between the elements is aiding. This is shown and may be more readily seen by referring to the schematic diagram of Figure 2.

It will be apparent that the various conducting arms and sliding members may be straight and parallel bus bars having longitudinal rather than rotational motion. Also, the members need not lie in any one plane or any one cylindrical surface. Various mechanical forms may be used to obtain the desired results. However, corresponding conducting arms or members should be adjacent one another substantially throughout their length, thus forming the two-turn loop.

Figure 2:
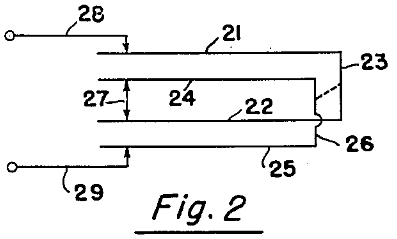
Figure 2 is a schematic diagram of the apparatus of Figure 1.
Figure 3:
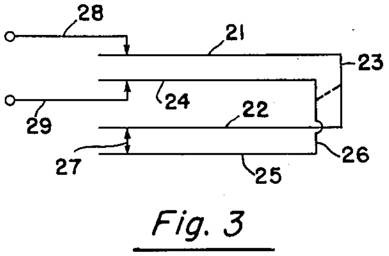
Figures 3, 4, 5, 6 and 7 are schematic diagrams representing modifications of the electrical connections of the apparatus of Figure 1.

The electrical contacts or switching arrangement may be varied so that the mutual inductance between the elements is opposing. Such an arrangement is shown in Figure 3. In this arrangement it may be seen that the two elements are connected electrically in series but that mutual inductance between corresponding arms is opposing because of their adjacent positioning and direction of electrical current. Thus, the total inductance formed by the unit, including the self inductance of the two turns and the mutual inductance, is considerably less than the total inductance resulting from the electrical connection arrangement shown in Figure 2. Therefore, different tuning ranges may be obtained.

Figure 4:
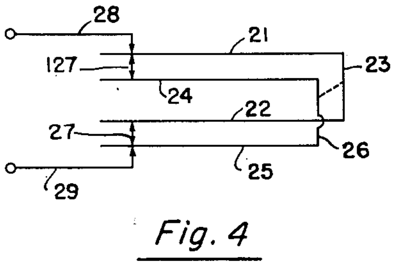
Figure 5:
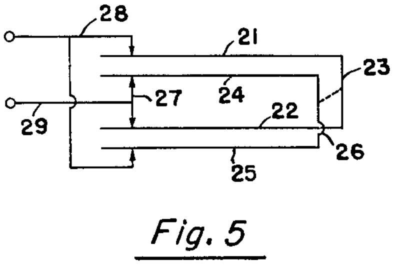

Further switching arrangements are shown in Figures 4 and 5. As may be seen in Figure 4, the two elements are connected electrically in parallel with mutual inductance aiding. In Figure 5, the two turns are again connected electrically in parallel and the mutual inductance is opposing.

Figure 6:
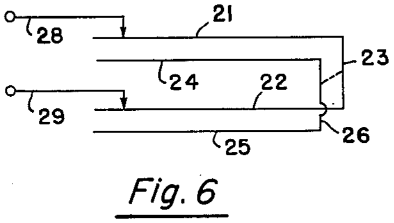
Figure 7:
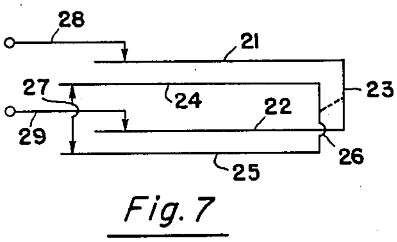

Additional switching arrangements are shown in Figures 6 and 7. In these arrangements only one element is used for tuning, the other element being left open as in Figure 6, or shorted as in Figure 7. In addition to the above, the unused element can be connected to a suitable capacitive element, or group of reactive elements, to form a tunable absorption circuit, or trap. Thus it may be seen that many electrical switching connections may be made so as to vary to considerable degree the total inductance range formed by the elements and thus the tuning range.

Figure 8:
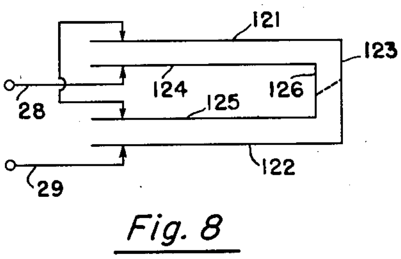
Figure 8 is a schematic diagram of a modification of the arrangement of the elements of Figure 1.

In Figure 8 there is shown a modification in which one element formed by the arms 121 and 122 are joined by the shorting bar 123. The second element formed by the parallel conducting arms 124 and 125 are joined by a connecting bar 126. In accordance with this modification, this second element is arranged so as to be completely encompassed by the first element. Corresponding conducting arms 121 and 124 are adjacent, however, as are corresponding conducting arms 122 and 125. Thus, similar electrical characteristics may be obtained by the modification shown in Figure 8 as that obtained by the structure disclosed in Figures 1 through 7.

Figure 9:
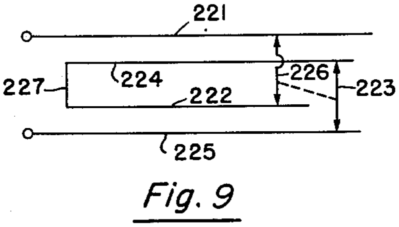
Figure 9 is a schematic diagram representing a modification of the apparatus of Figure 1, involving a change in the moving elements thereof.

Another form of the invention is shown in Figure 9 in which the stator conducting arms 221 and 222 form part of the tuning elements. Additional stator arms 224 and 225 running parallel therewith and having corresponding arms adjacent, as before, complete the two turn loop unit. A rotor shorting bar 226 joins the conducting arm 221 with the conducting arm 222 while a rotor shorting bar 223 joins the conducting bars 224 and 225. The two arms 222 and 224 may be joined at the other end thereof by a stator connecting bar 227. It will be apparent that the same electrical variations may be obtained with this structure as were obtained in the various structures described previously. For various mechanical reasons, however, different parts of the two looped or tuning elements may be made rotor or stator and it is for this purpose that the modification is shown in Figure 9 in which the shorting stubs become the rotor elements.

Figure 10:
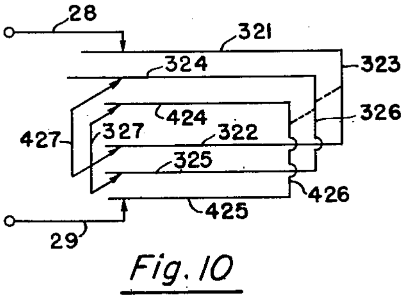
Figure 10 is a schematic diagram of yet another modification utilizing additional elements similar to those shown in Figure 1.

It will be apparent that more than two U-shaped elements may be combined to further modify the mutual inductance and the tuning range. Such a structure is shown in Figure 10, in which three U-shaped turns are combined. In each instance, however, the corresponding arms of the U-shaped elements should be adjacent each other so as to make possible the variations in mutual inductance aiding or opposing and obtain the increased or decreased values of inductance. Through suitable switching arrangements the various elements may be connected in series or parallel and in combinations, to provide a great range in mutual inductance. In Figure 10 the various elements are identified by reference characters corresponding to similar elements shown in each of the previous figures except that the numerals are preceded by an additional digit to distinguish over the earlier identified elements.

Figure 11:
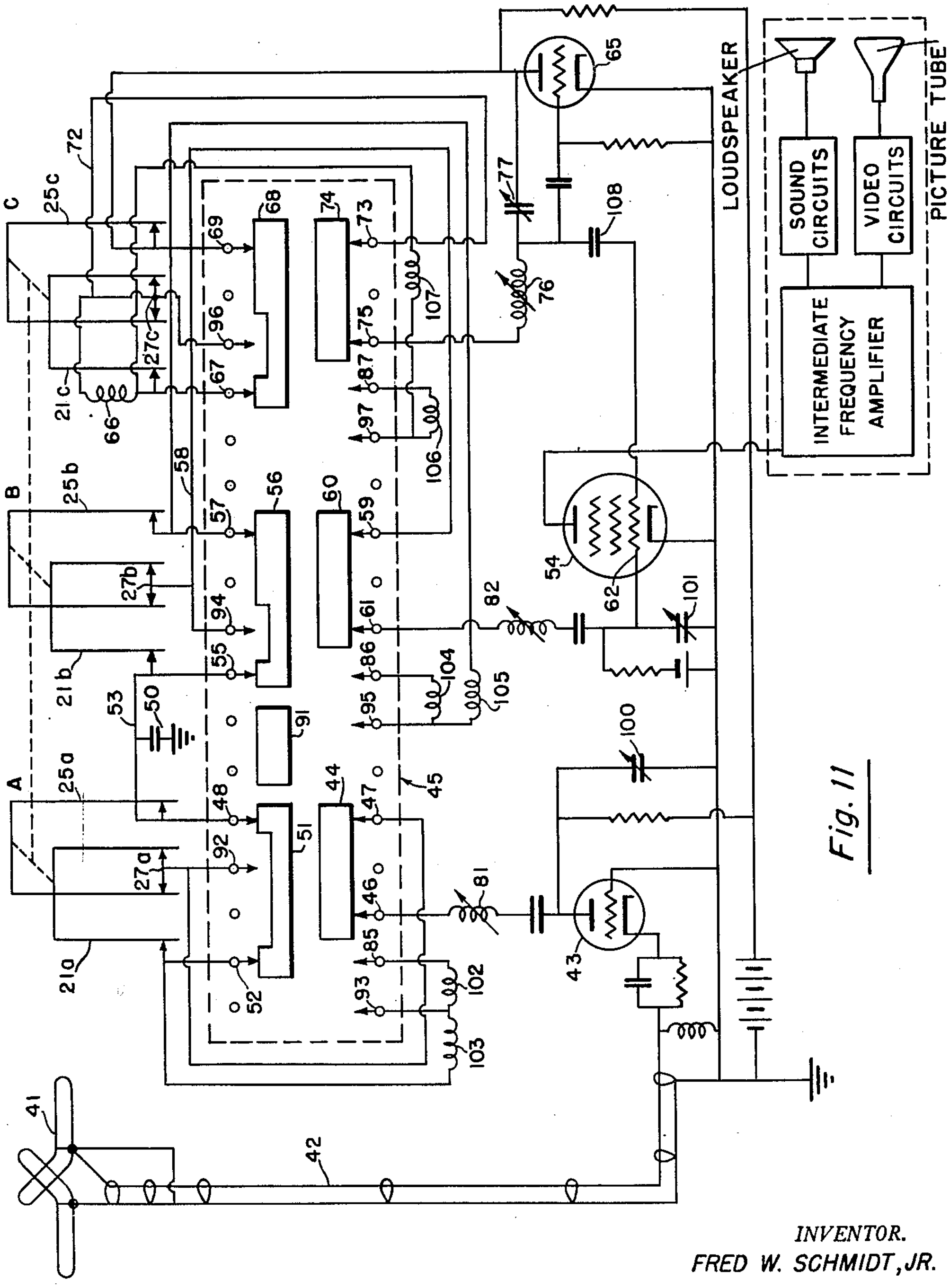
Figure 11 is a schematic diagram partially in block diagram form of a television receiver showing in detail the use of this invention in a television receiver.

Referring now to Figure 11, a television receiver is illustrated showing the use of the invention in the input section thereof, which input section includes an r. f. amplifier and a local heterodyne oscillator and mixer. Three tuning elements A, B and C corresponding to the tuning elements shown in Figures 1 through 7 are incorporated in the three r. f. input stages of the receiver. A three position switch is utilized so that the elements of the two turn loops may be combined in several of the various ways as described above so as to tune over those portions of the radio frequency spectrum corresponding to the present day low television band, the FM band, and the high television band. While these three bands are mentioned for illustrative purposes, it will be obvious that the invention may be incorporated in other circuits to cover other tuning ranges.

A signal received by the dipole unit 41 is conducted by means of a suitable line such as a coaxial line 42 to the input circuits of the receiver. The signal is fed to a first amplifier tube 43 which, together with its associated circuit components as shown, comprises the first r. f. amplifying stage. A tuning element A is connected in the anode circuit of the amplifier stage of the tube 43 so as to be a part of the tuned circuit thereof. As may be seen, the signal is fed to a conducting strip 44 forming part of the switching unit, indicated generally by the reference character 45 and comprising a plurality of individual switches. In the switch position shown, the conducting strip 44 connects the terminal 46 with a second terminal 47, the latter terminal being connected to a shorting bar 27*a* forming a part of the tuning element A. In the preferred physical embodiment, the connecting means is a short wide strip directly connecting points 47 and 92 on the switch, similar strips connecting the points 94 and 59, and 96 and 73, respectively, the schematic arrangement of which will be described hereinafter. In the switch position shown, one contacting arm 25*a* of the tuning element A is connected through terminal 48 to a conducting strip 51, which, in turn, as may be seen, contacts a terminal 52. The terminal 52 is, in turn, connected to the conducting arm 21*a* of the tuning element A. The terminal 48 is also connected through a suitable conductor 53 to the following stage of the receiver. As may be seen, the tuning element A is connected so that the two turns are electrically in parallel and the mutual inductance is opposing.

The second tuning element B is connected in the circuit of the following mixer stage formed by the tube 54, together with its associated circuits, coupling between the elements A and B being provided by a suitable capacitor 50. The signal from the conductor 53 is fed to one of the loops of the tuning element B and also through a terminal 55 and conducting strip 56 to a terminal 57 which, in turn, is connected to the second of the two turn loops of the tuning element B. As may be seen, the second tuning element B is also connected so that the loops are in parallel and the mutual inductance is opposing. The signal is fed from the tuning element B by a suitable conductor 58 and terminal 59 to a conducting strip 60 and thence through terminal 61 to the grid 62 of the mixer tube 54.

The signal is mixed in the tube 54 with the local oscillator signal and fed to the intermediate frequency amplifier stages of the receiver in the usual way.

The local oscillator stage of the receiver comprises the tube 65 together with its associated circuits including the tuning element C and the padding inductance 66. As may be seen, one leg 21*c* of one of the U-shaped elements is connected to a terminal 67 on the switch contacting the conducting strip 68. Another terminal 69 also contacts the conducting strip 68 so as to make electrical contact with the leg 25*c* of the tuning element C. As before, the two loops of the tuning element C are connected in parallel with their inductance opposing, the remaining legs of the element being interconnected by the shorting bar 27*c*. This point, that is, the shorting bar 27*c*, is connected by a suitable conductor 72 to a terminal 73 contacting the conducting strip 74 on the switch 45. This conducting strip 74 on the switching unit also contacts the terminal 75 which is connected through a padding inductance 76 and adjustable capacitor 77 to the anode of the oscillator tube 65, the capacitor 77 providing part of the tuning capacitance for the oscillator and also a means for compensating for variations in tube capacitance.

Power is supplied to the operating tubes in the usual way. The oscillator signal may be fed to the grid 62 of mixer tube 54 by means of a capacitor 108 connected to the oscillator circuit.

As pointed out previously, in the switch position shown, the elements of the tunable loops A, B and C are connected in parallel with one another but having the mutual inductance oppose the self inductance. The alignment of this band is preferably by means of adjustable inductances 81 in the plate circuit of the first r. f. amplifier tube 43, and the inductance 82 in the grid circuit of the mixer tube 62 and inductance 76 in the oscillator stage, the oscillator being padded by means of the fixed inductance 66. Compensation for variations in tube and circuit capacitances is accomplished by adjustment of the trimmer capacitors 77, 100 and 101. In this position signals from the upper television band are received in the antenna, amplified by the tube 43, resonated in the double tuned circuit composed of tunable loops A and B and associated elements and mixed in the mixer tube 54 with the local oscillator signal generated within the oscillator tube 65 and tuned by means of the tunable loop C.

Figure 12:
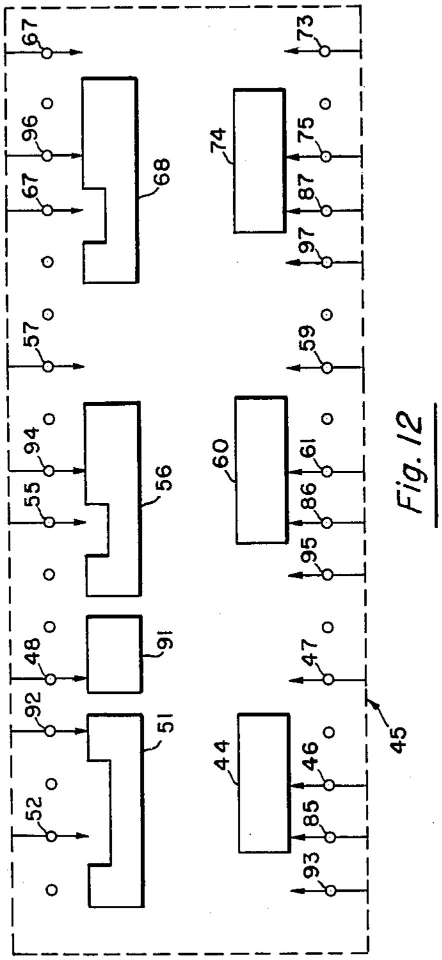
Figures 12 and 13 are views of the switching arrangement shown in Figure 11 representing additional switch positions.

In the second position of the switch (moved to the left in the drawing), the elements in each tunable loop are connected in series, in this case with the mutual inductance aiding the self inductance. This switch position is illustrated in Figure 12. As may be seen, the conducting strip 51 on the switching unit 45 has moved to the left so as to disconnect the terminals 48 and 52. At the same time, the conducting strip 44 has moved to the left so as to connect terminal 46 with terminal 85. As may be seen by referring again to Figure 11, terminal 85 is connected to the conducting leg 21*a* of the tuning element A. Thus, the signal from the anode of the amplifier tube 43 is fed to the leg 21*a* of tuning element A and after passing through the two loops of this tuning element it is coupled to the tuning element B by means of conductor 53 and the coupling capacitor 50. At the same time, the conducting strip 56 is moved to the left so as to disconnect terminal 55 from terminal 57 and conducting strip 60 has moved to the left so as to disconnect terminal 59 from terminal 61. Terminal 61 is now connected to terminal 86 so that the signal from the tuning element B is fed to the grid of the tube 54 through terminals 86 and 61. In the oscillator stage, the conducting strip 68 has disconnected terminal 67 from terminal 69 while the conducting strip 74 has disconnected terminal 73 from terminal 75. Terminal 75 is now connected to terminal 87.

The fixed inductances 102 and 103 are connected in series with the tunable loop A. Similarly, the fixed inductances 104 and 105 are connected in series with the tunable loop B and the fixed inductances 106 and 107 are in series with the oscillator tunable loop C. If alignment of this band is desired, the inductances 102, 104 and 106 can be made adjustable.

Figure 13:
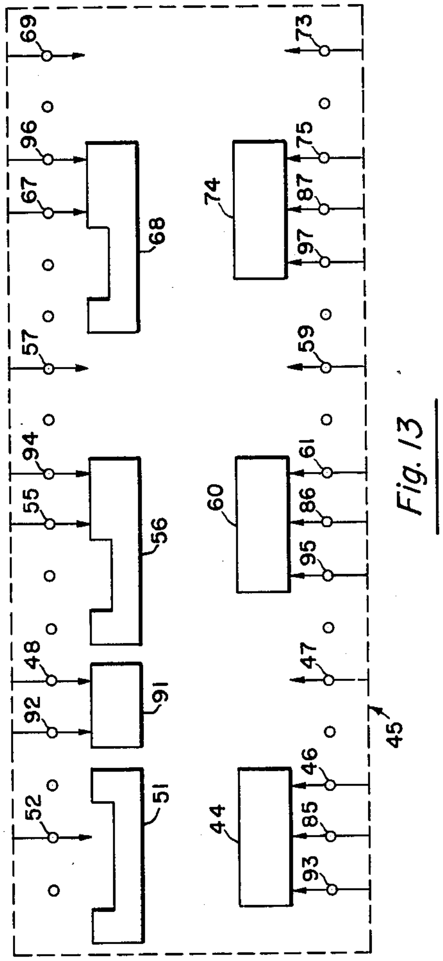

In the third position of the switch, only one element of each of the tunable loops is utilized, the other element being short circuited. This switch position is shown in Figure 13. As may be seen, the conducting strip 91 on the switching unit 45 has now connected terminal 48 in the first r. f. amplifier stage to the terminal 92. By referring again to Figure 11, it may be seen that terminal 92 is connected to the shorting bar 27*a* on tuning element A. At the same time the conducting strip 44 now connects terminal 46 with both terminals 85 and 93. In the mixer stage the conducting strip 56 has connected terminal 55 with terminal 94. Terminal 94, as may be seen in Figure 11, is connected to the shorting bar 27*b* of the tuning element B. The conducting strip 60 now connects terminal 61 with terminal 86 and terminal 95. In the oscillator stage the conducting strip 68 connects terminal 67 with terminal 96. As may be seen in Figure 9, terminal 96 is connected to the shorting bar 21*c* of the tuning element C. The conducting strip 74 now connects terminal 75 with the two terminals 87 and 97.

Fixed inductances 102, 104 and 106 are each short circuited, leaving only the fixed inductances 103, 105 and 107 in series respectively with the tunable loops. These may be made variable if alignment of this band is desired.

Since only the sound signal exists in these frequency modulated broadcasts, the portion of the television receiver which provides the visible portion of the television program need not be utilized and can be made inoperative, if desired, by an auxiliary contact on the switch.

The sound signal in this case is fed as usual, through the intermediate frequency amplifier, the sound intermediate frequency amplifier, the sound detector, the audio amplifier, and the loudspeaker, all in accordance with standard practice.

The elements of the tunable loop can be connected in many ways, providing opportunities to eliminate padding and trimming coils by combining functions. By suitable switching, there are at least six ways of connecting the elements of the two turn loop in a tuned circuit. These are:

(1) In series, with mutual inductance aiding. This connection is shown in Figure 2.

(2) In series, with mutual inductance opposing, Figure 3.

(3) In parallel, with mutual inductance aiding, Figure 4.

(4) In parallel, with mutual inductance opposing, Figure 5, and position I of the switch opposing, in Figure 9.

(5) One loop used alone, with the other open, Figure 6.

(6) One loop used alone, with the other shorted, Figure 7, and position III of the switch.

In addition to the above, because of its unique versatility, my invention is readily adaptable to many unusual types of circuits. For instance, when large image rejection is required, one element of each section can be used as a tuning means, and the other as a tunable absorption circuit, or trap, always tuned to the frequency it is desired to reject.

The scope of my invention can best be understood by reference to the following claims.

I claim:

1. A tuning element comprising a plurality of U-shaped electrical conductors having parallel arms, said conductors being in mutual fixed proximity with similar parts being parallel, the distances between the corresponding arms of any one to another of said conductors being less than the distance between said parallel arms of any one of said conductors, contact arms electrically insulated from each other and respectively positioned to engage said parallel arms, said parallel arms being slidable along and with respect to said contact arms, and electrical circuits connected between said contact arms.

2. A tuning element comprising a pair of U-shaped electrical conductors having parallel arms, said conductors being arranged in fixed mutual proximity with similar parts being parallel and adjacent, the distance between the arms of one conductor and the corresponding arms of the other conductor being less than the distance between the arms of either one of said conductors, and contact arms electrically insulated from each other and respectively positioned to engage said parallel conductor arms, said parallel arms being slidable along and with respect to said contact arms, and electrical circuits connected between said contact arms.

3. The apparatus of claim 1, said contact arms being fixedly positioned and said conductors being curved and rotatable so that said parallel arms at all times make electrical contact with said contact arms.

4. The apparatus of claim 1, all of said conductor arms being in substantially the same plane.

5. The apparatus of claim 1 in which said electrical circuits comprise a switching unit having switch contacts to connect selectively said conductor arms in series and in parallel.

6. A tuning element comprising a first U-shaped electrical conductor having a first arm and a second arm, said arms being positioned in substantially mutual parallel relationship; a second U-shaped electrical conductor having a first arm and a second arm, said arms being positioned in substantially mutual parallel relationship, said conductors being arranged in fixed mutual proximity with said first arms being parallel and adjacent and said second arms being parallel and adjacent, the distances between said first arms and between said second arms being less than the distance between the arms of either one of said conductors, a first sliding contact positioned to engage said first arm of said first conductor, a second sliding contact positioned to engage said second arm of said first conductor, a third sliding contact positioned to engage said first arm of said second conductor, a fourth sliding contact positioned to engage said second arm of said second conductor, and a switching unit having a first terminal connected to said first sliding contact, a second terminal connected jointly to said second and third sliding contacts, and a third terminal connected to said fourth sliding contact, said switching unit comprising selective switching means to connect selectively and electrically said first terminal to said second terminal and said first terminal to said third terminal.

7. A tuning device for electrical energy comprising a plurality of impedance elements, a conductor enclosing substantially three sides of a surface area, a second conductor in close proximity to said conductor, said second conductor substantially enclosing more than half of said area, sliding contact means positioned to respectively engage the opposite sides of each said conductor for changing the effective size of said area, and a switching unit connected to said contact means for selectively connecting said conductors electrically in series and in parallel combination, said switching unit being also connected to said impedance elements for selectively connecting said elements with said conductors.

8. A tuning device comprising a plurality of electrical conductors, each of said conductors being shaped to bound a substantially rectangular area, on three sides thereof, said conductors being located in fixed space relationship to one another so that said area bounded by each of said conductors overlaps and mutually occupies a major portion of the area bounded by the others of said conductors, and means for changing the electrically useful size of at least one of said areas, said means comprising a plurality of contact arms respectively positioned to engage at least one of said conductors at two points thereon at opposite sides of said area bounded thereby, said contact arms being slidable along and with respect to said conductor.

FRED W. SCHMIDT, Jr.

REFERENCES CITED

The following references are of record in the file of this patent:

UNITED STATES PATENTS

| Number | Name | Date |
|---|---|---|
| 1,660,108 | Vignolo | Feb. 21, 1928 |
| 2,093,750 | De Vries | Sept. 21, 1937 |
| 2,341,346 | Summerhayes | Feb. 8, 1944 |
| 2,438,912 | Hansen et al. | Apr. 6, 1948 |
| 2,475,637 | Vladimir | July 12, 1949 |
| 2,477,749 | Jacob | Aug. 2, 1949 |
| 2,537,052 | Haeff et al. | Jan. 9, 1951 |
| 2,554,295 | Cooper | May 22, 1951 |

FOREIGN PATENTS

| Number | Country | Date |
|---|---|---|
| 604,652 | Great Britain | July 7, 1948 |